(12) United States Patent  
Pecht et al.

(10) Patent No.: US 7,220,131 B1  
(45) Date of Patent: May 22, 2007

(54) ELECTROMECHANICAL DEVICE HAVING A PLURALITY OF BUNDLES OF FIBERS FOR INTERCONNECTING TWO PLANAR SURFACES

(75) Inventors: Michael G. Pecht, Hyattsville, MD (US); Joseph A. Swift, Ontario, NY (US); Stanley J. Wallace, Victor, NY (US); Yuliang Deng, Greenbelt, MD (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 11/530,932

(22) Filed: Sep. 12, 2006

Related U.S. Application Data

(60) Provisional application No. 60/743,051, filed on Dec. 20, 2005.

(51) Int. Cl.
*H01R 12/00* (2006.01)
*H05K 1/00* (2006.01)

(52) U.S. Cl. ...................................................... 439/65

(58) Field of Classification Search .................. 439/65, 439/66, 86, 291, 930; 174/262, 264; 428/300.4; 361/220, 222
See application file for complete search history.

(56) References Cited

U.S. PATENT DOCUMENTS

| | | | |
|---|---|---|---|
| 4,641,949 A | | 2/1987 | Wallace et al. |
| 5,220,481 A | | 6/1993 | Swift et al. |
| 5,250,756 A | * | 10/1993 | Swift et al. .............. 174/119 R |
| 5,281,771 A | * | 1/1994 | Swift et al. .................. 174/262 |
| 5,354,607 A | * | 10/1994 | Swift et al. .................. 310/251 |
| 5,414,216 A | * | 5/1995 | Swift et al. ............. 174/124 R |
| 5,843,567 A | * | 12/1998 | Swift et al. .................. 428/221 |
| 6,872,681 B2 | | 3/2005 | Niu et al. |
| 6,872,791 B1 | | 3/2005 | Lee et al. |
| 6,891,324 B2 | | 5/2005 | Dorfman |
| 2005/0029009 A1 | | 2/2005 | Swift et al. |

* cited by examiner

*Primary Examiner*—Chandrika Prasad
(74) *Attorney, Agent, or Firm*—MH2 Technology Law Group

(57) ABSTRACT

According to various embodiments, exemplary interconnects and methods for interconnection are provided that can include contacts formed by fiber bundles. The exemplary interconnects can be used to form separable or non-separable electro-mechanical connections between one or more of the generally accepted six levels of interconnection. In various embodiments, the exemplary interconnects can allow management of the thermal properties of the electronic devices. Exemplary interconnects can also provided reduced thickness allowing redundancy and additional compliance as desired.

24 Claims, 5 Drawing Sheets

# ELECTROMECHANICAL DEVICE HAVING A PLURALITY OF BUNDLES OF FIBERS FOR INTERCONNECTING TWO PLANAR SURFACES

CROSS-REFERENCE TO RELATED APPLICATIONS

This application claims priority to U.S. Provisional Patent Application Ser. No. 60/743,051 filed on Dec. 20, 2005, the disclosure of which is incorporated by reference herein in its entirety.

FIELD OF THE INVENTION

The subject matter of this invention relates to electrical connections. More particularly, the subject matter of this invention relates to interconnects used for electronic packaging.

BACKGROUND

Interconnections allow communications between various electronic devices that form an electronic system. An electronic system can be thought of as a hierarchical interconnection network that can include up to six generally accepted levels of interconnection. The six levels include interconnections between: (1) chip bonding pads to a package leadframe, device substrate, a circuit board, or an LCD or display substrate; (2) an electronic component and a printed circuit board (PCB); (3) a first PCB and a second PCB; (4) a first subassembly and a second subassembly; (5) a subassembly and the input-output (I/O) for a system; (6) an electronic system and a peripheral device.

For example, to electrically connect an electronic component such as an integrated circuit (IC) to a PCB, a permanent solder or adhesive joint can be used. Alternatively, a conventional component socket or "interposer," consisting of sockets to receive the pins or pads of the IC on one side and the pins or pads of the PCB on the other side can be used. A conventional component socket can have thousands of connections. Failure of any one of the individual contacts in the IC, the PCB, or the component socket can result in failure of the entire assembly. Conventional interconnects including torsion wire contacts, compressive spring wire contacts, and pogo pin contacts are often unreliable and can cause short assembly lives. One solution to this problem is to use metal (solder) bonds or conductive adhesive, which of course renders the interconnect permanent and thereby makes removal of the IC or separation of the IC-component socket-PCB difficult and expensive.

Thus, there is a need to overcome these and other problems of the prior art to provide interconnects and methods for electrical connection that enable higher reliability in high density electronic assemblies.

SUMMARY

In accordance with various embodiments of the invention, there is an interconnect device including a plurality of fiber bundles each including a plurality of fibers, wherein a first end of each of the fiber bundles forms a first contact and a second end of each of the fiber bundles forms a second contact. The exemplary interconnect device can further include a metal layer disposed on at least a portion of the plurality of fibers in each fiber bundle. An insulating layer can surround the plurality of fiber bundles to configure the first contacts and the second contacts in an array.

In accordance with various other embodiments of the invention, there is an interconnect device including a plurality fiber bundles, wherein a first end of each of the fiber bundles forms a first contact and a second end of each of the fiber bundles forms a second contact. The exemplary interconnect device can further include a metal layer disposed on at least a portion of the plurality of fibers in each fiber bundle. A first layer can surround each of the fiber bundles. A thermally conductive electrically insulating layer can surround the first layers to configure the first contacts and the second contacts in an array, wherein each of the fiber bundles includes a plurality of carbon fibers and at least one strand including one or more of a solder and a conductive adhesive.

In accordance with still other embodiments of the invention, there is method for connecting an integrated circuit package to a printed circuit board. The exemplary method can include providing an interconnector including a plurality of contacts, wherein each of the plurality of contacts includes a fiber bundle, the fiber bundle including a plurality of metal coated fibers and one or more strands of solder, and wherein the fiber bundles are disposed in a polymer matrix such that first ends of the fiber bundles form a plurality of first side contacts and second ends of the fiber bundles form a plurality of second side contacts. A printed circuit board (PCB) including a plurality of PCB contacts can be provided and joined to the interconnector by connecting the PCB contacts to the first side contacts of the interposer. An integrated circuit package including a plurality of integrated circuit contacts can also be provided. The integrated circuit package can be soldered to the interconnector by connecting the integrated circuit contacts to the second side contacts of the interposer.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

As used herein, the term "interconnect" is used interchangeably with "interconnect device" and refers to devices that can be used for connecting electronic devices across one or more of the generally accepted six levels of interconnection in an electronic system.

As used herein, the term "substrate" refers to a supporting layer or structure including, but not limited to a printed circuit board (PCB) and a printed wiring board (PWB).

FIGS. 1–6 depict exemplary embodiments of interconnects in accordance with the present teachings that can include contacts formed by fiber bundles. The exemplary interconnects can be used to form separable or non-separable electromechanical connections between one or more of the generally accepted six levels of interconnection. In various embodiments, the exemplary interconnects can allow management of the thermal properties of the electronic devices. Exemplary interconnects can also provided reduced thickness allowing redundancy and additional compliance as desired.

Figure 1:
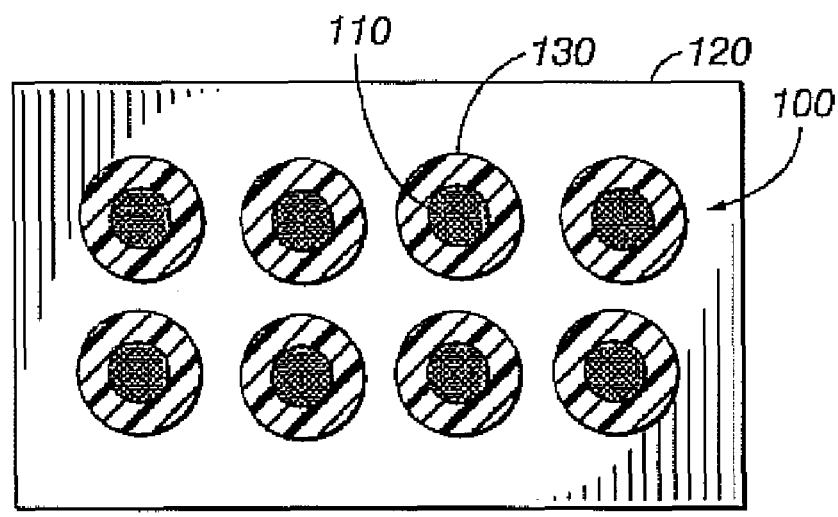
FIG. 1 is a schematic view showing an interconnect in accordance with the present teachings.
Figure 2:
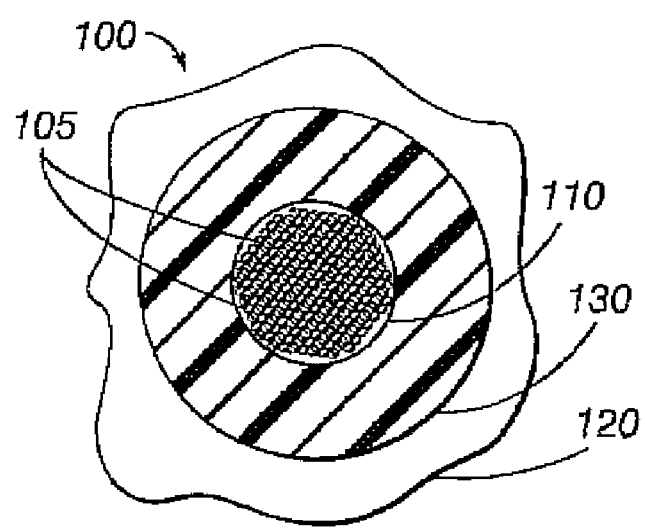
FIG. 2 is an enlarged schematic view of a contact of the interconnect of FIG. 1 in accordance with the present teachings.

According to various embodiments, an exemplary interconnect can include contacts formed by a plurality of conductive fibers. FIG. 1 depicts a top view of an exemplary interconnect 100 including a plurality of contacts 110. FIG. 2, showing an enlarged view of contact 110 of interconnect 100, depicts contact 110 formed of a fiber bundle, where each fiber bundle includes a plurality of conductive fibers 105. In certain embodiments, a first layer 130 can be disposed surrounding at least a portion of each of the fiber bundles forming contact 110. In various embodiments, first layers 130 can be surrounded by an insulating layer 120 to fix the contacts 110 in a desired array. Although FIG. 1 depicts a 2×4 array, one of ordinary skill in the art will understand that other configurations are contemplated. In various embodiments, contacts 110 can be disposed in an array to enable connection to an electronic device. The electronic device can include one or more of a resistor, a transistor, a liquid crystal display (LCD), an electro-optic device, a multi-chip module, a sensor, a connector, a fuse, a circuit board, a power supply, and a ground.

Conductive fibers 105 can be formed of conductive materials, for example, carbon fiber, carbon/graphite fiber, doped silicon, conductive particle or ionic salt filled polymeric fibers, or metalized fibers. Fibers 105 can also take the form of nanowires, nanotubes, and nanorods which are made from any suitable conductive or semiconductive material. The number of fibers 105 forming contact 110 can vary as desired, for example, from 2 to thousands of fibers. The diameter of fibers 105 can vary as desired from about 1 nanometer (nm) to about 50 microns. In various other embodiments, conductive fibers 105 can be formed of a core made from an insulating or semi-insulating material(s) including, but not limited to, boron nitride, silicon dioxide, and doped silicon dioxide, and/or a conductive coating over the core formed oft for example, one or more metal layers. In various other embodiments, contacts 110 can be formed of carbon fiber composites such as CarbonConX™ (Xerox Corporation, New York).

Figure 3:
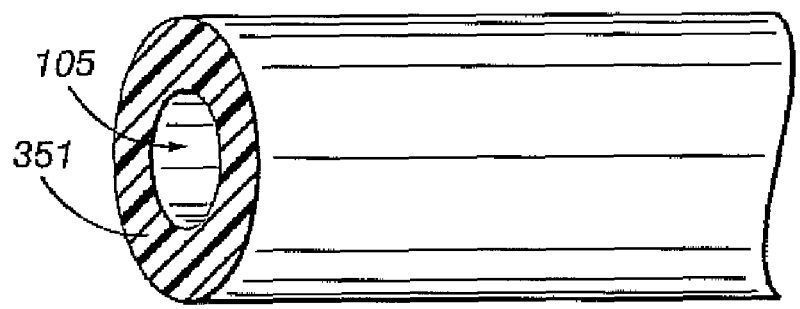
FIG. 3 is an enlarged schematic view of a fiber of the contact of FIG. 2 in accordance with the present teachings.

Referring to FIG. 3, one or more of the fibers 105 can be coated with a metal layer 351 over all or a portion of their surface. In various embodiments, metal layer 351 can have a thickness of about 0.001 microns to about 20 microns. In various other embodiments, metal layer 351 can represent from about 0.01% to about 50% of the mass of the base fiber 105. Metal layer 351 can be formed of, for example, one or more layers of metals or metal alloys including, for example, nickel, copper, gold, platinum, tungsten, silver, palladium, tin, iron, aluminum, zinc, chromium, lead, alloys such as brass, nickel/boron, gold/carbon, palladium/nickel, silver/carbon, and the like, and combinations thereof. The metal layer can also be formed of a metal alloy such as tin/lead or similar solder. Metal layer 351 can be formed by, for example, vacuum-deposition, vapor-phase deposition, electroplated, or electroless plated, or a combination of these methods. In an embodiment, wherein fibers 105 are formed of a conductive material, all or a portion of the surface of fibers 105 can be coated with metal layer 351. In an embodiment, wherein fibers 105 are formed of insulating or semi-insulating materials, metal layer 351 can coat almost the entire surface of fibers 105.

According to various other embodiments, metal layer 351 can coat a portion of each of the fibers disposed at a periphery of the plurality of fibers. For example, metal coating 351 can coat a portion of each of fibers 105 disposed at the periphery of the fiber bundle, as shown in FIG. 2. In other words, metal coating 351 can cover a portion of each of fibers 105 disposed adjacent to first layer 130.

Referring back to FIG. 1, first layer 130 can be formed of a thermally conductive and electrically insulating material. In various embodiments, first layer 130 can be formed of a flexible, non-brittle polymer including, but not limited to polyethylene, polypropylene, polytetrafluroethylene, polyethersulphone, polyetheretherketone, polyimide, polyester, polyparaxylene, silicone, polyurethane, PVC, PET, PBT, NBR, ABS, and Viton™. To promote bonding between the first layer and insulating layer 120, the material used for the first layer and/or insulating layer 120 may be of a cross-linkable type polymer that is applied as a sleeve, then partially crosslinked or partially cured then fully crosslinked once the sleeved fiber bundles are assembled into the surrounding insulating layer 130. First layer 130 can surround and contain fibers 105, and facilitate handling, cutting, and positioning of the fibers during formation of insulating layer 120. In an exemplary embodiment, first layer 130 can be a heat shrinkable polymer. First layer 130 and the insulating layer 120 may be constructed of suitable insulator materials to prevent the loss of the signal or power currents while confining these to the desired paths. In addition the polymers chosen for first layer 130 and insulating layer 120 may provide a structure role in addition to securing the fiber 105 within the desired configuration. In various other embodiments, first layer 130 can be formed of one or more of a polymer, an insulating material, and a conductive material.

Insulating layer 120 can be formed of one or more of a silicone, nylon, polyamide (PA), ABS, polyimide (PI), polycarbonate (PC), polyvinylchloride (PVC), polyvinylacetate (PVA), polyethyleneterepthalate (PET), polybutylterepthalate (PBT), polyetheretherketone (PEEK), polyphenylsulphide (PPS), polyurethane (PU), polyethylene (PE), polypropylene (PP), polystyrene (PS), polytetrafluoroethylene (PTFE), phenolic, epoxy, and copolymers, blends, mixtures and composites thereof. Interconnect 100 can be formed from insulating layer 120 by methods known to one of ordinary skill in the art including, but not limited to, compression molding, resin transfer molding, insert-injection molding, reaction injection molding, casting, including liquid-resin casting, and laminating.

Figure 4:
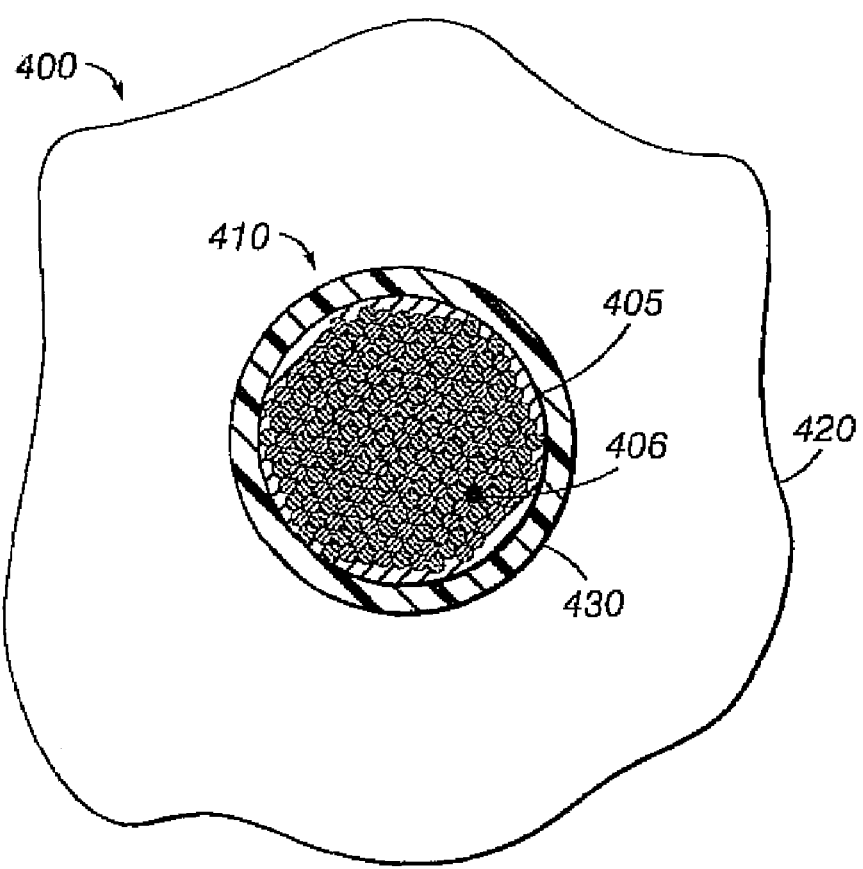
FIG. 4 is an enlarged schematic view of a contact including a strand of solder in accordance with the present teachings.

According to various other embodiments, the contacts of the interconnect can be formed by a plurality of conductive fibers and one or more strands of solder and/or conductive adhesive, instead of or in addition to metal coating 351. Alternately, the solder or conductive adhesive can be in the form of a fine powder that is deposited onto the fiber, by for example an electrostatic powder spray techniques. As used herein, the term "solder" also includes eutectic alloys that can be used for electrical connections. FIG. 4 depicts an enlarged view of contact 410 that forms a part of an interconnect 400. Contact 410 can be formed of a plurality of conductive fibers 405 and one or more strands of solder 406. A first layer 430 can be disposed surrounding the plurality of conductive fibers 405 and the one or more strands of solder 406. First layer 430 can be surrounded by an insulating layer 420 to fix the contacts 410 in a desired array. According to various other embodiments, a conductive-metal, particle filled thermoplastic suitable for use as an adhesive can be configured into fine fibrous strands (not shown) and incorporated into the contact 410 in similar fashion as the previously described solder strands 406. Similarly, thin strands of a conductive semi-solid cross-linkable polymer such as green stage epoxy can be incorporated as strands 406 within the contact 410.

The exemplary interconnects described herein can be formed using an automated process to allow low cost, efficient, large scale manufacture. For example, the fibers can be fed into a thin-walled polymer heat shrinkable tubing. Once the fibers are in position, heat can be used to shrink the polymer tube onto the fibers, securing them within the tube. The fibers within the tube can then be cut into segments having a desired length. The length of the fiber segments should be sufficient to span the thickness of the subsequent polymer layer. The fiber segments can then be positioned in the desired array such that a polymer can be applied to encase the fiber segments and allowed to solidify by cooling and/or crosslinking. One of ordinary skill in the art will recognize that other methods can be used to form the disclosed interconnects.

Figure 5:
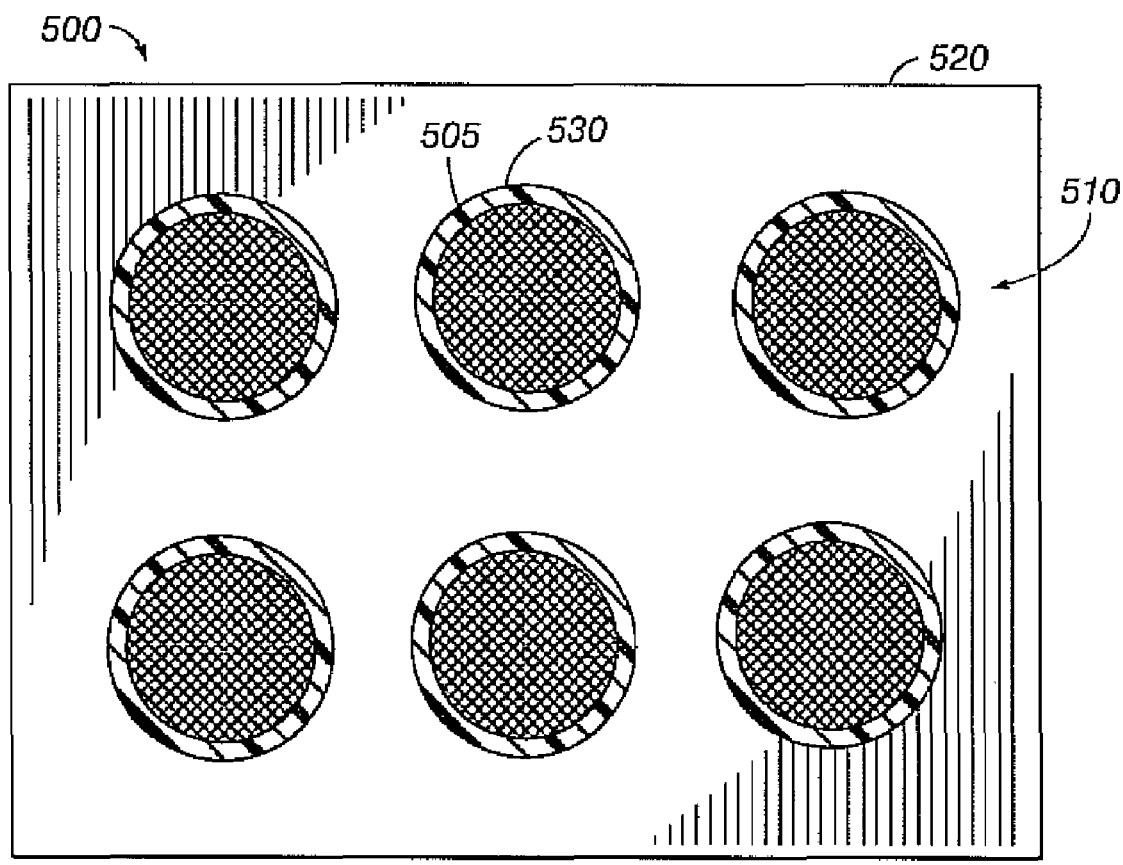
FIG. 5 is a schematic top view showing an interconnect in accordance with the present teachings.

FIG. 5 depicts a top-view of an exemplary interconnect 500 in accordance with the present teachings. Interconnect 500 can include a plurality of contacts 510 disposed in a 2×3 array and a pitch of 1.0 mm, 1.27 mm or 1.5 mm. A finer pitch of less than 1.0 mm can also be used. One of ordinary skill in the art will understand that the 2×3 array and disclosed pitch are exemplary and that the number and arrangement of contacts 510 can be configured as desired, for example, to match the bond pads of a printed wiring board. Each contact 510 can be formed from several to 1000 or more carbon fibers, where each carbon fiber has a diameter of about 5 to 10 microns. In an exemplary embodiment, carbon fibers 505 can be formed of polyacrylonitrile (PAN). Carbon fibers 505 can further be coated with one or more layers of nickel. Alternatively, carbon fibers 505 can be coated with one or more layers of nickel and one or more layers of a noble metal such as gold. A first layer 530 can be disposed surrounding the plurality of conductive fibers 505 forming contact 510. First layers 530 can be surrounded by an insulating layer 520 to fix the contacts 510 in the desired array. Insulating layer 520 can be, for example, a polymer such as an epoxy.

Figure 6:
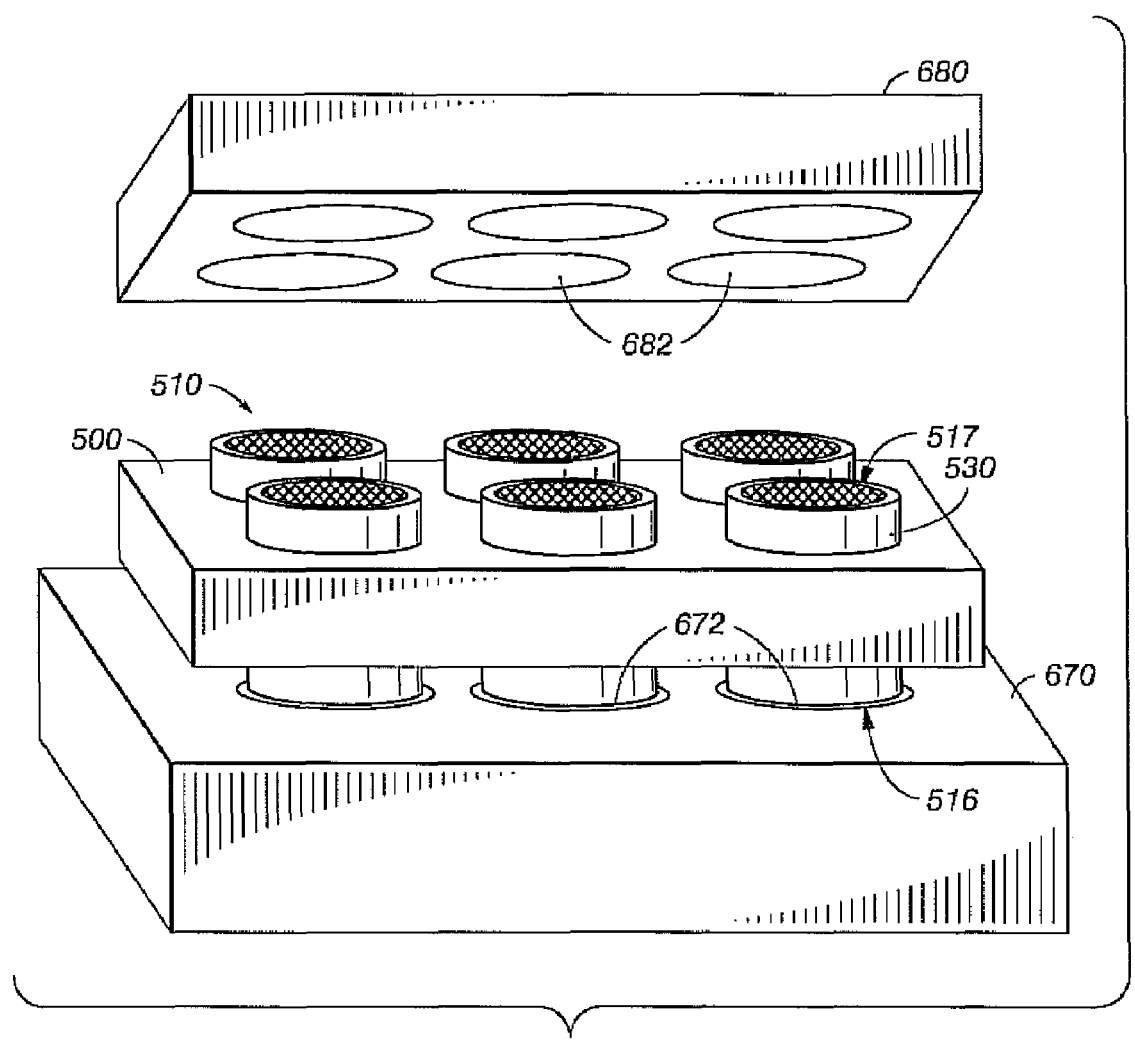
FIG. 6 is a cross sectional side view showing an interconnection between a substrate and a semiconductor chip in accordance with the present teachings.

FIG. 6 depicts a plan view of interconnect 500 shown in FIG. 5. Each contact 510 can have a first side 516 and a second side 517. The first sides 516 of contacts 510 can be used, for example, to electrically connect to a substrate, such as a printed circuit board (PCB) 670. To make electrical connection, PCB 670 can include contact pads 672 disposed in an array that matches the array of contacts 510. In various embodiments, the electrical connection can be made non-separable by soldering the first sides 516 of interconnect 500 to the contact pads 672 of PCB 670. Solder can be provided, for example, by one or more solder strands bundled within sleeve 530 with carbon fibers 505 as disclosed herein. Because at least a portion of the carbon fibers 505 are coated with one or more layers of metal, molten solder can wet and bond to fibers 505.

Second sides 517 of contacts 510 can be used to connect, for example, to a semiconductor chip 680. To make electrical connection, semiconductor chip 680 can include contact pads 682 disposed in an array that matches the array of contacts 510. In various embodiments, the electrical connection can be made non-separable by soldering the second sides 517 of interconnect 500 to the contact pads 682 of semiconductor 680. As above, the molten solder can wet and bond to fibers 505 because at least a portion of the carbon fibers 505 are coated with one or more layers of metal.

Figure 7:
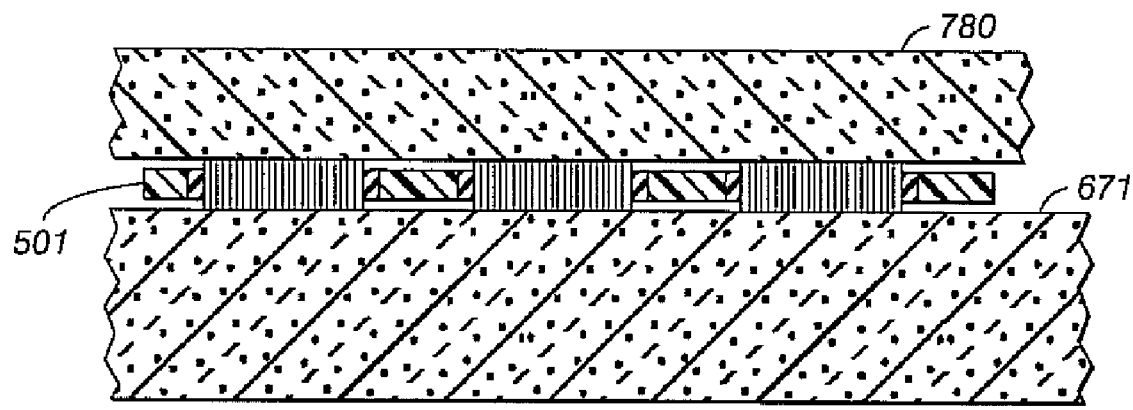
FIG. 7 is a cross sectional side view showing an interconnection between a first substrate and a second substrate in accordance with the present teachings.

In various embodiments, an interconnect 501 can be used to connect a first substrate 6711 for example, to a second substrate or second PCB 770, as shown in the cross sectional side view of FIG. 7. Second PCB 770 can include contact pads (not shown) disposed in an array that matches the array of contacts of interconnect 501.

Figure 8:
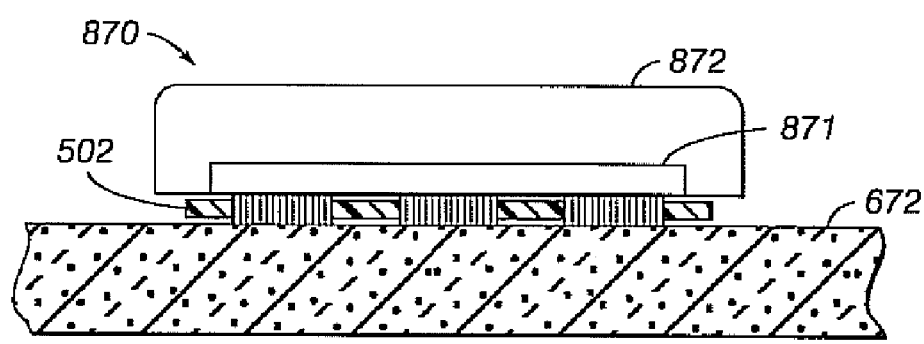
FIG. 8 is a cross sectional side view showing an interconnection between a substrate and an integrated circuit package in accordance with the present teachings.

In various embodiments, an interconnect 501 can be used to connect a substrate 672, for example, to an integrated circuit package 870, as shown in the cross sectional side view of FIG. 8. Integrated circuit package 870 can include a die 871 and a molding compound 872. Integrated circuit package 870 can further include contact pads (not shown) disposed in an array that matches the array of contacts of interconnect 502.

The assemblies formed using exemplary interconnect 500 can include separable and/or non-separable connections. Non-separable connections can be those intended to be permanent, such as, for example, connections formed with solder. Separable connections can include those intended to be temporary connections, such as, for example, those formed for use as sockets. The electrical connections formed by the plurality of fibers 505 to the contact pads can be highly reliable because the individual fibers can act independently to create many points of contact providing redundancy. Further fibers 105 formed of carbon, for example, can provide superior thermal expansion and thermal conductivity properties compared to conventional interconnects. The contact formed in this manner can also be capable of many mating cycles without loss of integrity. Still further, the flexibility of the fibers provides contact wipe for separable contacts when removal of a coating or oxide film is advantageous.

It is contemplated that present teachings can be used to make connections with various geometries and structures for all six levels of interconnections. For example, at level 2, it is contemplated that the present teachings can be used to form production sockets as well as test/burn-in sockets. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An interconnect device comprising:
   a plurality of fiber bundles each comprising a plurality of fibers, wherein a first end of each of the fiber bundles forms a first contact and a second end of each of the fiber bundles forms a second contact;
   a metal layer disposed on at least a portion of the plurality of fibers in each fiber bundle; and
   an insulating layer surrounding the plurality of fiber bundles to configure the first contacts and the second contacts in an array.

2. The interconnect device of claim 1, further comprising a first layer surrounding at least a portion of the fibers of each of the fiber bundles, wherein the first layer is thermally conductive and electrically insulating.

3. The interconnect device of claim 1, wherein the metal layer has a thickness of about 0.001 microns to about 20 microns.

4. The interconnect device of claim 1, wherein the metal layer covers only a portion of the length of the fibers.

5. The interconnect device of claim 1, wherein the metal layer is disposed on the fibers at a periphery of each bundle.

6. The interconnect device of claim 1, wherein the fibers comprises one of carbon, silicon, doped silicon, boron nitride, silicon dioxide, doped silicon dioxide, and metal.

7. The interconnect device of claim 2, wherein the first layer comprises one or more of a polymer, an insulating material, and a conductive material.

8. The interconnect device of claim 1, wherein the insulating layer comprises one or more of a silicone, nylon, polyamide (PA), ABS, polyimide (PI), polycarbonate (PC), polyvinylchloride (PVC), polyvinylacetate (PVA), polyethyleneterepthalate (PET), polybutylterepthalate (PBT), polyetheretherketone (PEEK), polyphenylsulphide (PPS), polyurethane (PU), polyethylene (PE), polypropylene (PP), polystyrene (PS), polytetrafluoroethylene (PTFE), phenolic, epoxy, and copolymers, blends, mixtures and composites thereof.

9. The interconnect device of claim 1, wherein the plurality of fibers comprise one or more of nanowires, nanotubes, nanorods, carbon fiber, carbon/graphite fiber, conductive particle or ionic salt filled polymeric fibers, and metalized fibers.

10. The interconnect device of claim 1, wherein at least one of the first contacts and the second contacts are disposed in the array to enable connection to an electrical device.

11. The interconnect device of claim 10, wherein the electrical device comprises one or more of a resistor, a transistor, a liquid crystal display (LCD), an electro-optic device, a multi-chip module, a sensor, a connector, a fuse, a circuit board, a power supply, and a ground.

12. The interconnect device of claim 1 used in an assembly comprising; a substrate and an integrated circuit package to join the substrate to the integrated circuit package.

13. The interconnect device of claim 1 used in an assembly comprising; a first substrate and a second substrate to join the first substrate to the second substrate.

14. The interconnect device of claim 1 used in an assembly comprising; one or more semiconductor chips and a substrate to join the substrate to the one or more semiconductor chips.

15. An interconnect device comprising:
    a plurality of fiber bundles, wherein a first end of each of the fiber bundles forms a first contact and a second end of each of the fiber bundles forms a second contact;
    a metal layer disposed on at least a portion of the plurality of fibers in each fiber bundle;
    a first layer surrounding each of the fiber bundles; and
    a thermally conductive electrically insulating layer surrounding the first layers to configure the first contacts and the second contacts in an array,
    wherein each of the fiber bundles comprises a plurality of carbon fibers and at least one strand comprising one or more of a solder and a conductive adhesive.

16. The interconnect device of claim 15, wherein the first layer comprises one or more of a silicone, nylon, polyamide (PA), ABS, polyimide (PI), polycarbonate (PC), polyvinylchloride (PVC), polyvinylacetate (PVA), polyethyleneterepthalate (PET), polybutylterepthalate (PBT), polyetheretherketone (PEEK), polyphenylsulphide (PPS), polyurethane (PU), polyethylene (PE), polypropylene (PP), polystyrene (PS), polytetrafluoroethylene (PTFE), phenolic, epoxy, and copolymers, blends, mixtures and composites thereof.

17. The interconnect device of claim 15, wherein the metal layer is formed by one or more of vapor deposition, electrodeposition, electroless deposition, and vacuum deposition.

18. A method for connecting an integrated circuit package to a printed circuit board comprising:
    providing an interconnector comprising a plurality of contacts, wherein each of the plurality of contacts comprise a fiber bundle, the fiber bundle comprising a plurality of metal coated fibers and one or more strands of solder, and wherein the fiber bundles are disposed in a polymer matrix such that first ends of the fiber bundles form a plurality of first side contacts and second ends of the fiber bundles form a plurality of second side contacts;
    providing a printed circuit board (PCB) comprising a plurality of PCB contacts;
    joining the printed circuit board to the interconnector by connecting the PCB contacts to the first side contacts of the interconnector;
    providing an integrated circuit package comprising a plurality of integrated circuit contacts; and
    soldering the integrated circuit package to the interconnector by connecting the integrated circuit contacts to the second side contacts of the interconnector.

19. The method of claim 18, wherein the step of joining the printed circuit board to the interconnector by connecting the PCB contacts to the first side contacts of the interconnector comprises forming a separable electromechanical connection.

20. The method of claim 18, wherein the step of joining the printed circuit board to the interconnector by connecting the PCB contacts to the first side contacts of the interconnector comprises forming a non-separable connection.

21. The method of claim 18, wherein the step of joining the printed circuit board to the interconnector by connecting the PCB contacts to the first side contacts of the interconnector comprises soldering the PCB contacts to the corresponding first end of the fiber bundles on the first side of the interconnector.

22. The method of claim 18, wherein the step of joining the printed circuit board to the interconnector by connecting the PCB contacts to the first side contacts of the interconnector comprises forming a separable connection between the PCB contacts and the corresponding first end of the fiber bundles on the first side of the interconnector.

23. The method of claim 18, wherein the metal coating on the plurality of fibers enables the solder to wet and bond to the fibers.

24. The method of claim 18, wherein the integrated circuit package comprises one or more of a microprocessor, an ASIC, a DSP, a memory, a surface mount component, a resistor, a capacitor, a display elements, an LED, a switch, a relay, a sensors, an electro-optic device, and a multi-chip module.

* * * * *